(12) United States Patent
Hardin, Jr. et al.

(10) Patent No.: US 10,014,802 B2
(45) Date of Patent: Jul. 3, 2018

(54) SYSTEMS AND METHODS OF HARVESTING ENERGY IN A WELLBORE

(71) Applicant: HALLIBURTON ENERGY SERVICES, INC., Houston, TX (US)

(72) Inventors: John R. Hardin, Jr., Spring, TX (US); Mark Sitka, Richmond, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 87 days.

(21) Appl. No.: 15/096,347

(22) Filed: Apr. 12, 2016

(65) Prior Publication Data

US 2016/0226405 A1     Aug. 4, 2016

Related U.S. Application Data

(62) Division of application No. 14/073,152, filed on Nov. 6, 2013, now Pat. No. 9,337,705, which is a division of application No. 13/242,716, filed on Sep. 23, 2011, now Pat. No. 8,604,632.

(60) Provisional application No. 61/451,483, filed on Mar. 10, 2011.

(51) Int. Cl.
| | |
|---|---|
| *F03B 13/00* | (2006.01) |
| *H02N 2/18* | (2006.01) |
| *E21B 41/00* | (2006.01) |
| *H02K 7/18* | (2006.01) |
| *H01L 41/12* | (2006.01) |

(52) U.S. Cl.
CPC ......... *H02N 2/185* (2013.01); *E21B 41/0085* (2013.01); *F03B 13/00* (2013.01); *H01L 41/125* (2013.01); *H02K 7/1823* (2013.01); *H02N 2/18* (2013.01)

(58) Field of Classification Search
CPC ...... H02N 2/185; E21B 41/0085; F03B 13/00
USPC .................. 290/54, 43; 166/66.5, 65.1, 248; 366/165.1, 174.1; 175/93, 320; 310/26
See application file for complete search history.

(56) References Cited

U.S. PATENT DOCUMENTS

| | | | |
|---|---|---|---|
| 2,825,534 A | | 3/1958 | Reid |
| 2,858,108 A | | 10/1958 | Wise et al. |
| 3,036,645 A | | 5/1962 | Rowley |
| 4,491,738 A | | 7/1985 | Peppers |
| 4,532,614 A | | 7/1985 | Peppers |
| 4,578,675 A | | 3/1986 | MacLeod |
| 5,172,020 A | | 12/1992 | Hibino et al. |
| 5,615,172 A | | 3/1997 | Kotlyar |
| 5,839,508 A | * | 11/1998 | Tubel .................. E21B 41/0085 166/65.1 |
| 6,504,258 B2 | | 1/2003 | Schultz et al. |
| 6,672,409 B1 | | 1/2004 | Dock et al. |
| 7,451,835 B1 | | 11/2008 | Hall et al. |
| 7,816,797 B2 | | 10/2010 | Nair |
| 7,816,799 B2 | | 10/2010 | Nair et al. |
| 7,816,833 B2 | | 10/2010 | Nair |
| 9,634,234 B2 | * | 4/2017 | Murphree ........... E21B 41/0085 |

(Continued)

*Primary Examiner* — Julio C. González
(74) *Attorney, Agent, or Firm* — Alan Bryson; Baker Botts L.L.P.

(57) ABSTRACT

A downhole assembly including a turbine to be disposed within a wellbore and a rotating array. The rotating array includes magnetic material and is coupled to the turbine. The downhole assembly also includes a magnetostrictive material coupled to the rotating array to strain the magnetostrictive material to induce an electric current in a conductor coupled to the magnetostrictive material.

5 Claims, 11 Drawing Sheets (56) References Cited

U.S. PATENT DOCUMENTS

| | | | |
|---|---|---|---|
| 2001/0040379 A1 | 11/2001 | Schultz et al. | |
| 2002/0039060 A1* | 4/2002 | Maruyama | H01L 41/12 335/220 |
| 2006/0254766 A1 | 11/2006 | Richard et al. | |
| 2008/0111431 A1 | 5/2008 | Dorel | |
| 2010/0127582 A1 | 5/2010 | Nair et al. | |
| 2010/0308670 A1 | 12/2010 | Nair et al. | |
| 2012/0228882 A1 | 9/2012 | Dirksen | |
| 2013/0099500 A1* | 4/2013 | Heisig | H02K 7/18 290/52 |
| 2013/0328316 A1* | 12/2013 | Rodney | E21B 41/0085 290/54 |
| 2014/0239745 A1* | 8/2014 | Nair | H01L 41/125 310/20 |
| 2014/0284937 A1* | 9/2014 | Dudley | E21B 4/003 290/1 R |

\* cited by examiner

SYSTEMS AND METHODS OF HARVESTING ENERGY IN A WELLBORE

CROSS-REFERENCE TO RELATED APPLICATION

This application is a divisional application of U.S. application Ser. No. 14/073,152, entitled "System and Methods of Harvesting Energy in a Wellbore" and filed on Nov. 6, 2013, and U.S. application Ser. No. 13/242,716, entitled "System and Methods of Harvesting Energy in a Wellbore" and filed on Sep. 23, 2011, and further claims the benefit of U.S. Provisional Application No. 61/451,483, which was filed Mar. 10, 2011, both of which are hereby incorporated by reference in their entirety.

BACKGROUND

The present disclosure relates generally to wellbore operations and, more particularly, to systems and methods of harvesting energy in a wellbore.

Power for use in a downhole environment has generally in the past been either stored in a device, such as a battery, and conveyed downhole or it has been transmitted via conductors, such as a wireline, from the space or another remote location. As is well known, batteries have the capability of storing only a finite amount of power therein and have environmental limits, such as temperature, on their use.

Electrical conductors, such as those in a conventional wireline, provide a practically unlimited amount of power, but require special facilities at the surface for deployment and typically obstruct the production flowpath, thereby preventing the use of safety valves, limiting the flow rate of fluids through the flowpath, etc., while the conductors are in the flowpath. Thus, wireline operations are typically carried out prior to the production phase of a well, or during remedial operations after the well has been placed into production.

In wellbore drilling operations, it is desirable to provide one or more efficient power sources downhole, for example, to power downhole instrumentation. A wide variety of devices may use mechanical energy in order to perform work downhole. Those devices may be subject to a variety of forces and may release energy in a number of ways. What is needed is a method of harvesting mechanical energy downhole and generating electrical power therefrom.

BRIEF DESCRIPTION OF THE DRAWINGS

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to wellbore operations and, more particularly, to systems and methods of harvesting energy in a wellbore.

Illustrative embodiments of the present disclosure are described in detail herein. In the interest of clarity, not all features of an actual implementation may be described in this specification. It will of course be appreciated that in the development of any such actual embodiment, numerous implementation specific decisions must be made to achieve the specific implementation goals, which will vary from one implementation to another. Moreover, it will be appreciated that such a development effort might be complex and time consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Devices and methods in accordance with certain embodiments may be used in one or more of wireline, measurement-while-drilling (MWD) and logging-while-drilling (LWD) operations.

In certain embodiments according to the present disclosure, magnetostrictive technology may be capable of generating electrical power during the process of drilling a borehole by using the mechanical energy generated in a downhole drilling assembly. Magnetostrictive materials have the ability to convert kinetic energy into magnetic energy that may be used to generate electrical power. Magnetostrictive materials have the property that, when strain is induced in the material, the change in linear dimensions produces a corresponding change in magnetic field about the material. In other words, mechanical loads can deform the material and thereby rotate magnetic domains. The change of the magnetic flux can be used to generate electrical power. A suitable material for the magnetostrictive material may be Terfenol-D, available from Etrema Products, Inc. Various materials, e.g., iron and iron alloys such as Terfenol, may provide suitable magnetostrictive and giant magnetostrictive responses. These materials normally respond to a force applied to their mechanical connection by creating a magnetic field which can be detected, for example, by a surrounding conductor coil.

Figure 1:
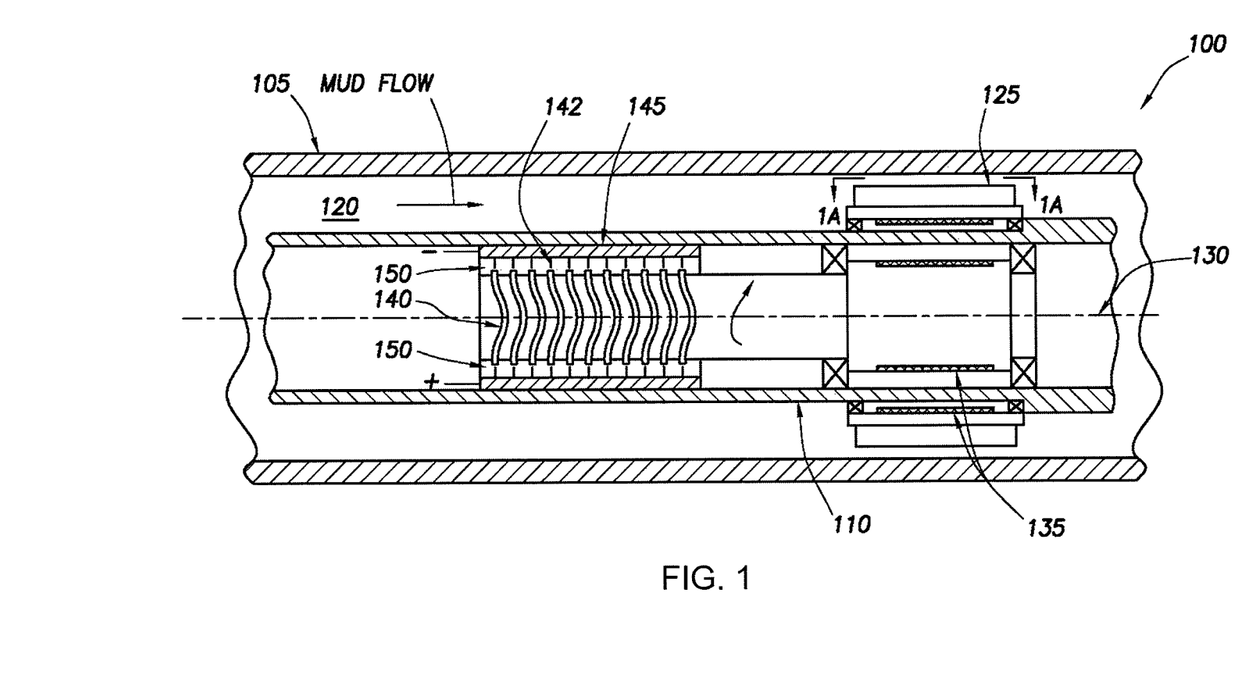
FIG. 1 is an illustration of an example drilling assembly section, in accordance with certain embodiments of the present disclosure.
Figure 1A:
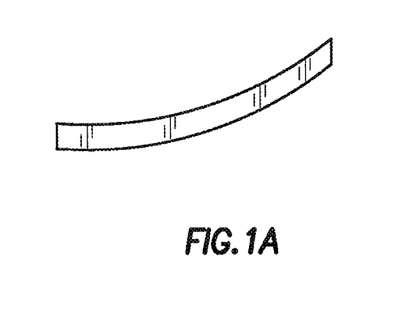
FIG. 1A is an illustration of a partial sectional view of the example drilling assembly section of FIG. 1, in accordance with certain embodiments of the present disclosure.

FIG. 1 is an illustration of an example drilling assembly section 100 in accordance with certain embodiments of the present disclosure. The drilling assembly section 100 may be part of a larger drill string assembly that, for example, may be suspended in a wellbore by a derrick (not shown). The drilling assembly section 100 may be disposed near the bottom of the wellbore. The drilling assembly section 100 may include a collar 105 having disposed therein a housing 110, which may be a sonde pressure housing. Between the collar 105 and housing 110 may be formed an annulus 120 to accommodate the flow of drilling mud therethrough. A turbine 125 may be disposed within the collar 105 and may have a plurality of turbine blades, each curved so as to rotate the turbine 125 due to sufficient mud flow through the annulus 120. FIG. 1A is an illustration of a view corresponding to section A-A of a turbine blade of the turbine 125, in accordance with certain embodiments of the present disclosure.

As shown in FIG. 1, a rotor 130 may be disposed within the housing 110 to provide a non-contact inertia drive. The rotor 130 may be suitably spaced so that non-contact magnetic coupling elements 135 of the turbine 125 and the rotor 130 do not make contact, but, when sufficient drilling mud flow drives the turbine 125, the turbine 125 in turn drives the rotor 130 via the magnetic coupling of the elements 135. Stated otherwise, the drilling assembly section 100 may be powered by linear energy of the mud flow being transferred to the rotor 130 through the turbine blades and the non-contact magnetic coupling elements 135. However, while a magnetic coupling is disclosed with this example, that type of coupling should not be seen as limiting. Alternative embodiments may include any other suitable type of coupling.

Coupled to the rotor 130 may be a rotating array 140. The array 140 may include a plurality of beams, each of which may have magnetic material 142 at one or both ends. As such, the array 140 may be a rotating magnet array. The array 140 may be disposed within a carriage 145, which may surround the array 140 and a portion of the rotor 130. The carriage 145 may be fixed to the housing 110 and may remain stationary while the array 140 and rotor 130 rotate.

Figure 1B:
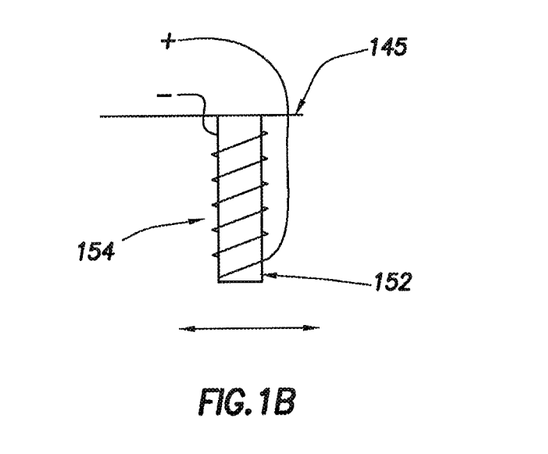
FIG. 1B is an illustration of a partial detailed view of the example drilling assembly section of FIG. 1, in accordance with certain embodiments of the present disclosure.

Affixed to the carriage 145 may be one or more magnetostrictive beam arrays 150. The magnetostrictive beam arrays 150 may include a plurality of beams 152, each beam 152 affixed to the carriage 145 at a one end. FIG. 1B is an illustration of a magnetostrictive beam 152 affixed to the carriage 145 at one end, in accordance with certain embodiments of the present disclosure. Each beam 152 may include magnetostrictive material.

Accordingly, the magnetostrictive beam arrays 150 may be coupled to the array 140, where coupling means magnetically or inductively coupled. As the array 140 rotates with the rotation of the rotor 130, the magnetic material 142 may likewise rotate past the magnetostrictive beam arrays 150 without making contact with the magnetostrictive beam arrays 150. The resulting oscillating magnetic field may cause alternating strain and relaxation of the beams 152. In response to that oscillating strain, the magnetostrictive material of the beams 152 may generate magnetic fields. About each beam 152 may be disposed a wire coil 154, a conductor in which the magnetic field of the beam 152 may induce an electric current. Each wire coil 154 and beam 152 may be coupled to allow current to be induced, which includes being coupled in direct contact or coupled magnetically or inductively, for example. Accordingly, with drilling assembly section 100, one method of harvesting the mechanical energy and generating electrical power includes using the mechanical energy of the mud flow to ultimately induce oscillating strain in the magnetostrictive beam arrays 150. In an alternative embodiment, an array of magnets may be affixed directly to the rotor 130 and disposed to alternately compress and relax the magnetostrictive beam arrays 150.

Figure 2:
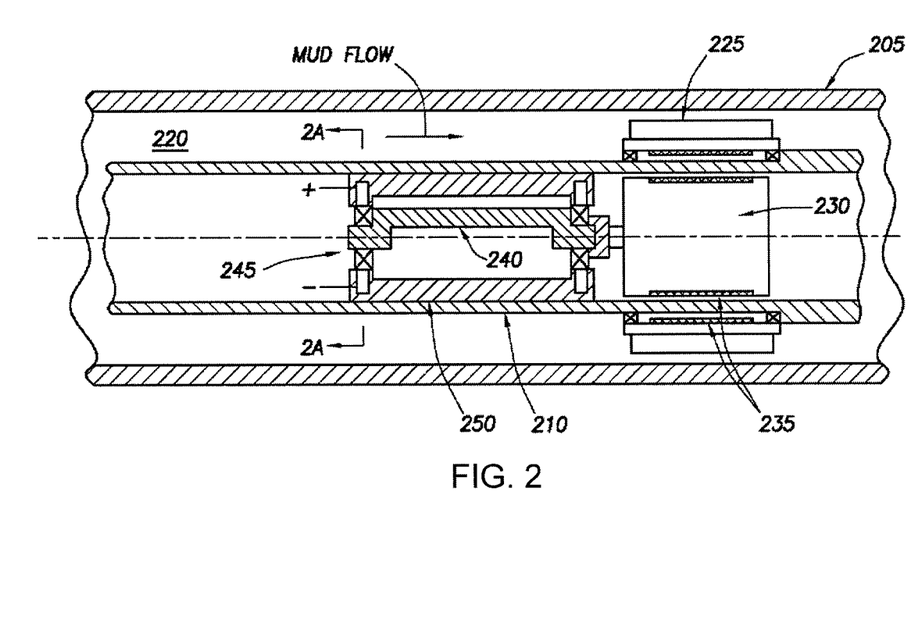
FIG. 2 is an illustration of an example drilling assembly section, in accordance with certain embodiments of the present disclosure.

FIG. 2 is an illustration of an example drilling assembly section 200, in accordance with certain embodiments of the present disclosure. The drilling assembly section 200 may be similar to the drilling assembly section 100 with respect to certain features, such as being part of a larger drill string assembly, being disposed near the bottom of a wellbore, and may include a collar 205, a housing 210, an annulus 220, and a turbine 225 with a rotor 230 and non-contact magnetic coupling elements 235 to provide a non-contact inertia drive when sufficient drilling mud flow drives the turbine 225. However, while a magnetic coupling is disclosed with this example, that type of coupling should not be seen as limiting. Alternative embodiments may include any other suitable type of coupling.

Figure 2A:
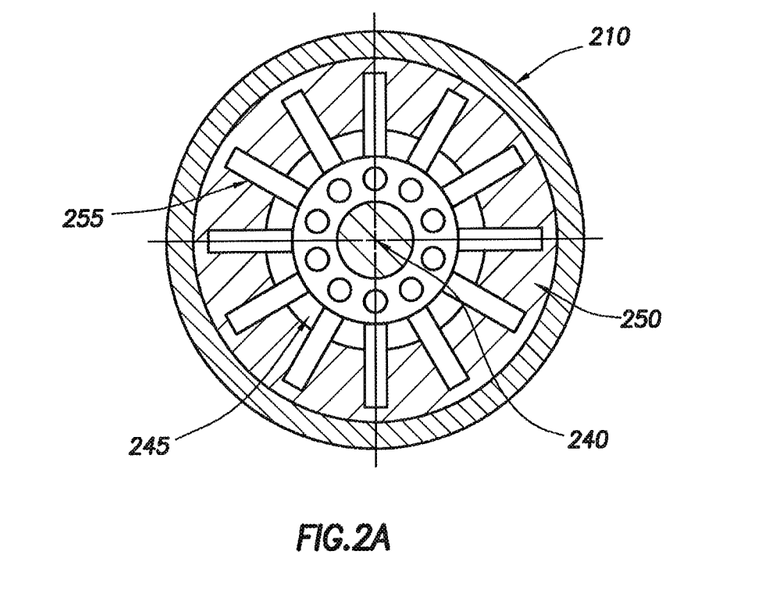
FIG. 2A is an illustration of a partial sectional view of the example drilling assembly section of FIG. 2, in accordance with certain embodiments of the present disclosure.

Coupled to the rotor 230 may be an imbalanced rotary load 240. The load 240 may take any suitable eccentric form that produces an imbalanced load when rotating with the rotor 230. An end portion the imbalanced rotary load 240 may be coupled to a bearing assembly 245. FIG. 2A is an illustration of a view corresponding to section A-A of the example drilling assembly section 200, in accordance with certain embodiments of the present disclosure.

Figure 2B:
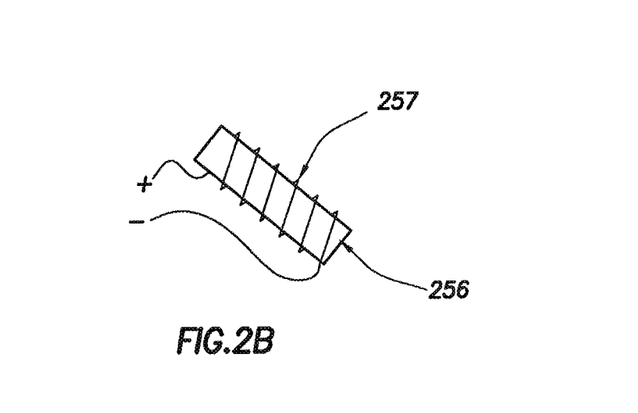
FIG. 2B is an illustration of a partial detailed view of the example drilling assembly section of FIG. 2, in accordance with certain embodiments of the present disclosure.

A carriage 250 may be fixed to the housing 210 and may remain stationary while the imbalanced rotary load 240 and rotor 230 rotate. Attached to the carriage 250 may be a circular array 255 of beams 256, each of which may include magnetostrictive material. FIG. 2B is an illustration of a detailed view of a component of the circular array 255, in accordance with certain embodiments of the present disclosure. As shown in FIG. 2B, about each beam 256 may be disposed a wire coil 257.

As the imbalanced rotary load 240 rotates, the resulting forces may be transferred to the array 255 via the bearing assembly 245, thereby repeatedly causing alternating compression and relaxation of the beams 256. The repeated strain induced in the magnetostrictive material may induce an electric current in the conductive wire coils 257. Thus, the eccentric weighting of the imbalanced rotary load 240 allows for inducing strain on the magnetostrictive material upon sufficient rotation of the rotor 230. Accordingly, with drilling assembly section 200, one method of harvesting the mechanical energy and generating electrical power is by using the mechanical energy of the mud flow to ultimately induce oscillating strain in the magnetostrictive beam array 255.

Figure 3:
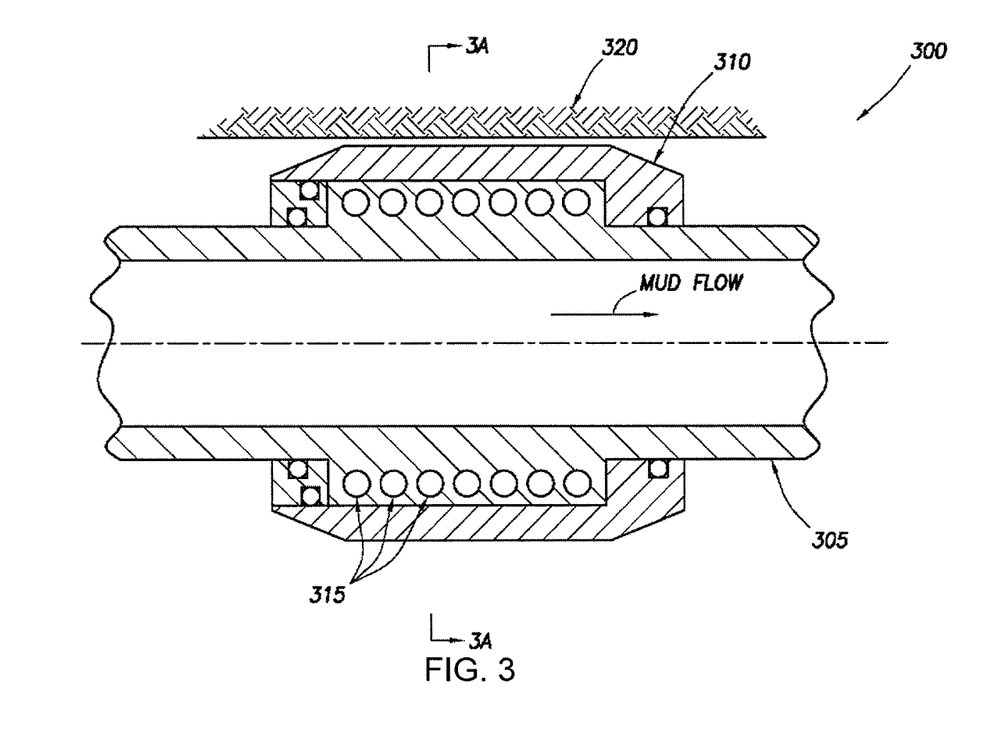
FIG. 3 is an illustration of an example drilling assembly section, in accordance with certain embodiments of the present disclosure.

FIG. 3 is an illustration of an example drilling assembly section 300, in accordance with certain embodiments of the present disclosure. In certain embodiments, mechanical energy may be typically generated as a result of a variety of forces bearing on a drilling assembly section. For example, the drilling assembly section may be subject to varying compression due to stabilizer(s) contacting the borehole wall. The points in the drilling hole assembly where the mechanical energy is being generated vary during the drilling process. If no special provisions are made, mechanical energy generation may not occur at all, or may occur but at insufficient levels to generate the electric energy sought. Certain embodiments according to the present disclosure provide for special provisions to ensure sufficient mechanical and electrical energy is generated at a point where magnetostrictive technology is deployed.

Figure 3A:
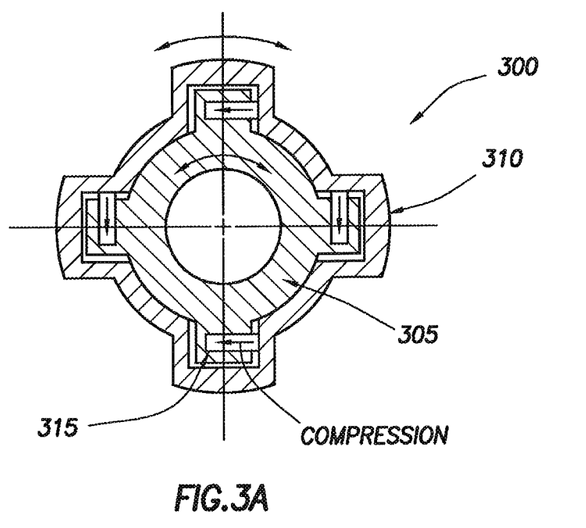
FIG. 3A is an illustration of a partial sectional view of the example drilling assembly section of FIG. 3, in accordance with certain embodiments of the present disclosure.

As with the drilling assembly section 100, the drilling assembly section 300 may be part of a larger drill string assembly that may be suspended in a wellbore, and the drilling assembly section 300 may be disposed near the bottom of the wellbore. The drilling assembly section 300 may be may be coupled directly or indirectly to a drill bit (not shown). The drilling assembly section 300 may include a collar 305. A stabilizer 310 may be attached to the collar 305. The stabilizer 310, for example, may be adapted to surround the collar 305 and may be a single piece or may comprise multiple pieces secured to the collar 305 in any suitably secure manner. In certain embodiments, the stabilizer 310 may be a non-rotating stabilizer that extends radially from the collar 305 to a surface of the formation 320. In certain embodiments, the stabilizer 310 may be a rotating stabilizer that rotates with the collar 305 and repeatedly contacts a surface of the formation 320. FIG. 3A is an illustration of a view corresponding to section A-A of the example drilling assembly section 300, in accordance with certain embodiments of the present disclosure.

Figure 3B:
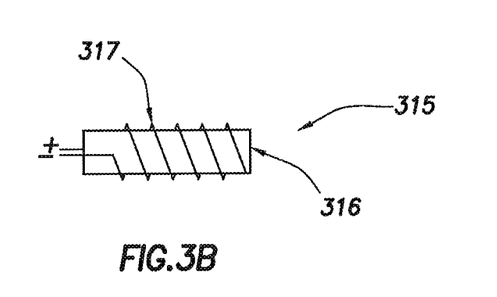
FIG. 3B is an illustration of a detailed view of the example drilling assembly section of FIG. 3, in accordance with certain embodiments of the present disclosure.

One or more magnetostrictive devices 315 may be embedded, or partially embedded, in the collar 305 with portions of the magnetostrictive devices 315 directly or indirectly contacting the stabilizer 310. FIG. 3B is an illustration of a detailed view of a component of a magnetostrictive device 315, in accordance with certain embodiments of the present disclosure. Each magnetostrictive device 315 may include a magnetostrictive material 316 surrounded by a wire coil 317. The magnetostrictive material 316 may be in any suitable form and, in certain embodiments, may be in the form of a rod. The wire coil 317 forms the electrical connection of the magnetostrictive device 315.

With the drilling assembly section 300, one method of harvesting the mechanical energy and generating electrical power is by disposing one or more magnetostrictive devices 315 between the collar 305 and the stabilizer 310. The points in a typical drill string where compressive energy is generated may vary during the drilling process. However, with the drilling assembly section 300, the stabilizer 310 imparts a compressive load on the magnetostrictive devices 315 as the stabilizer 310 impacts a surface of the formation 320. Sufficient compressive load may cause resulting strain in the one or more magnetostrictive devices 315. In response to that strain, the magnetostrictive material 316 of a magnetostrictive device 315 may generate a magnetic field, and an electric current is produced in the coils 317 of the magnetostrictive device 315. Thus, as the drilling assembly section 300 repetitively impacts the formation 320, the one or more magneto strictive devices 315 produce corresponding repetitive electric currents. Accordingly, the drilling assembly section 200 provides a stabilizer generator that transfers forces from the stabilizer 310 impacting the formation 320 to the magnetostrictive devices 315. The stabilizer 310 moves relative to the collar 305 to strain the magnetostrictive material 316 of the magnetostrictive devices 315 to alter the magnetic domains and thereby induce electrical current the coils 317.

Figure 4:
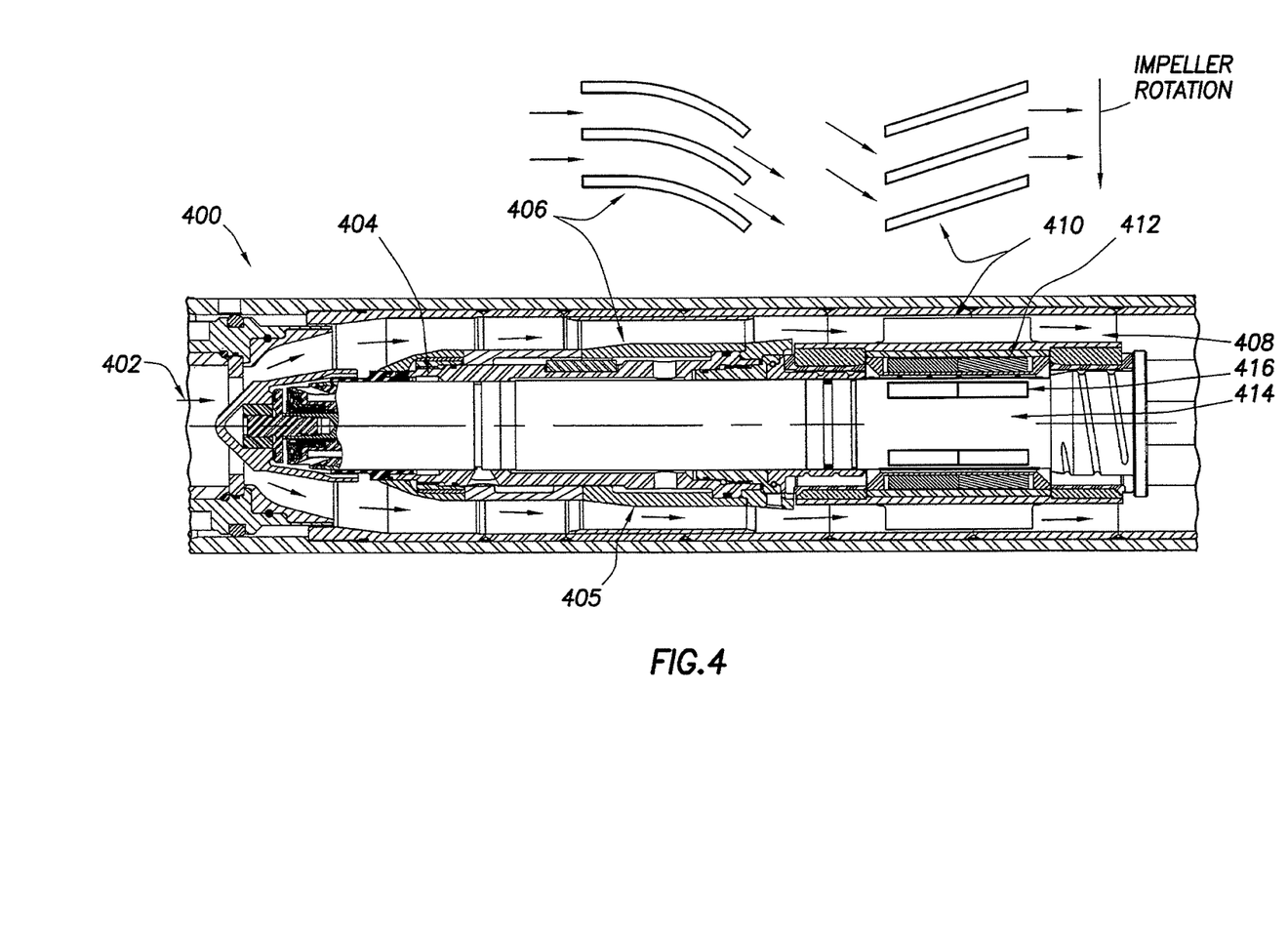
FIG. 4 is an illustration of a partial cross-sectional view of an example downhole assembly section, in accordance with certain embodiments of the present disclosure.

FIG. 4 is an illustration of a partial cross-sectional view of an example downhole assembly section 400, in accordance with certain embodiments of the present disclosure. The downhole assembly 400 includes a flow way 402 formed in the downhole component 400 to accommodate the flow of drilling mud. The downhole assembly section 400 may include a sonde pressure housing 404 disposed in the flow way 402. The sonde pressure housing 404 may include a stator 405 having multiple stator blades 406 extending from the stator 405 into the flow way 402 to accelerate and turn the mud flow to a more suitable velocity and angle of incidence as the mud flow exits the stator 405 and enters the impeller 408. The sonde pressure housing 404 may also include an impeller 408 having multiple impeller blades 410 extending from the impeller 408 into the flow way 402 to convert energy of the mud flow as it exits the stator 405 into rotational energy. Multiple magnets 412 may be attached to the impeller 408. A shaft 414 may be disposed inside the sonde pressure housing 404, the shaft 414 having multiple magnets 416 attached thereto. The shaft 414 may be suitably spaced to not contact the impeller 408. The impeller 408 with magnets 412 and the shaft 414 with magnets 416 may be disposed within the housing 410 to provide a non-contact inertia drive. With sufficient drilling mud flow driving the impeller 408, the impeller 408 in turn drives the shaft 414 via the magnetic coupling of the magnets 412 and 416. However, while a magnetic coupling is disclosed with this example, that type of coupling should not be seen as limiting. Alternative embodiments may include any other suitable type of coupling.

Figure 4A:
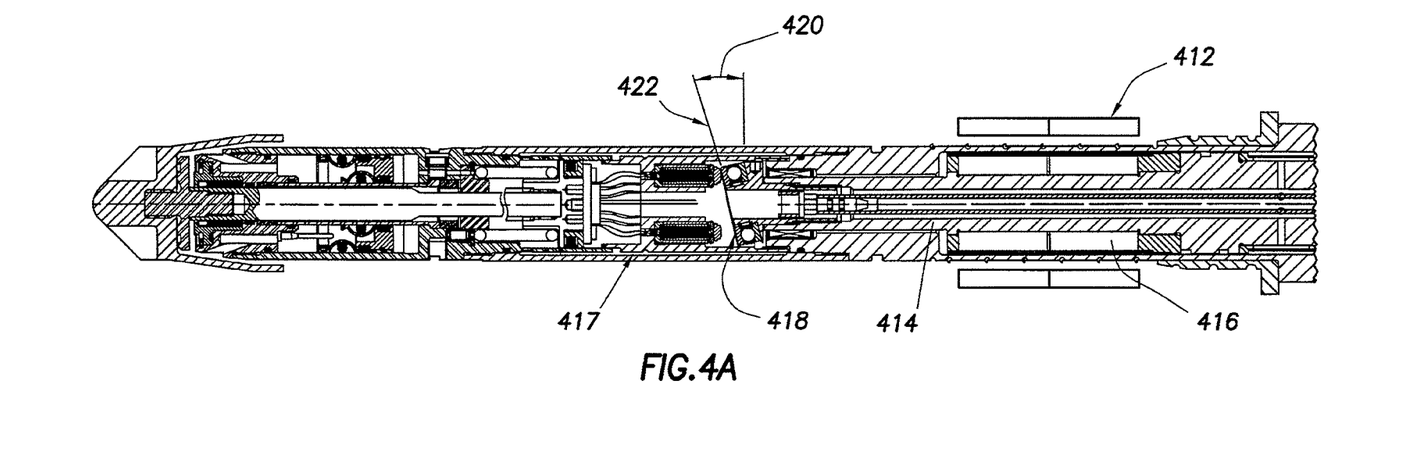
FIG. 4A is an illustration of a detailed partial cross-sectional view of the downhole assembly section of FIG. 4, in accordance with certain embodiments of the present disclosure.

FIG. 4A is an illustration of a detailed partial cross-sectional view of the sonde pressure housing 404 with a magnetostrictive generator 417, in accordance with certain embodiments of the present disclosure. A swash plate 418 may be coupled to the shaft 414 to rotate with rotation of the shaft 414. The swash plate 418 may be oriented at a swash plate angle 420 with respect to a plane perpendicular to the longitudinal axis of the shaft 414 and a swash plate bearing surface 422. As the shaft 414 and swash plate 418 rotate, a portion of the swash plate 418 that is distal from the shaft 414 rotates about the axis of shaft rotation.

Adjacent to the swash plate 418 may be one or more magnetostrictive devices 424 disposed to be alternately compressed and relaxed by the rotating distal portion of the swash plate 418. In an alternative embodiment, the one or more magnetostrictive devices 424 may be disposed to be alternately flexed and relaxed by the rotating distal portion of the swash plate 418.

Figure 4B:
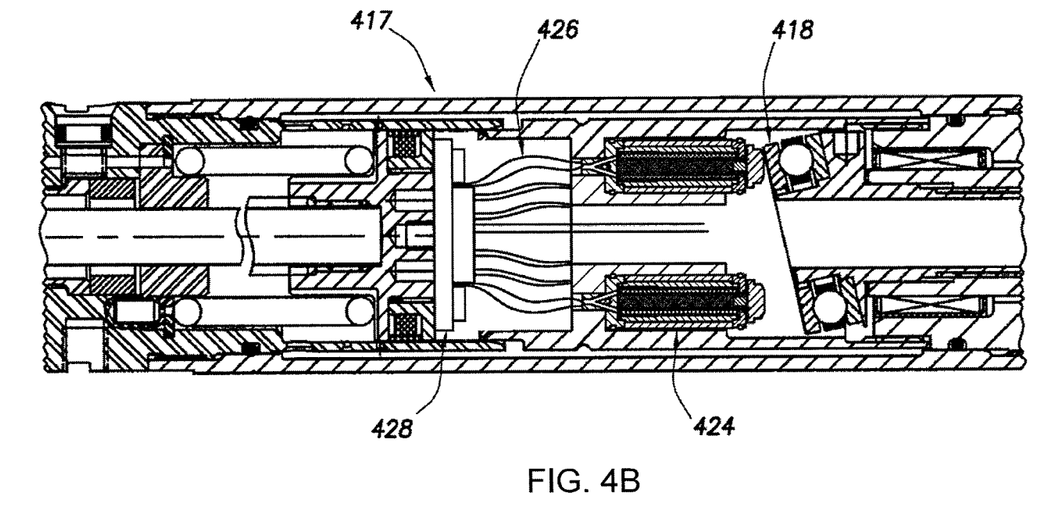
FIG. 4B is an illustration of another detailed partial cross-sectional view of the downhole assembly section of FIG. 4, in accordance with certain embodiments of the present disclosure.

FIG. 4B is an illustration of a detailed partial cross-sectional view of the sonde pressure housing 404 with a magnetostrictive generator 417, in accordance with certain embodiments of the present disclosure. Electrical connections 426 may couple the one or more magnetostrictive devices 424 to power conditioning electronics 428, which may be configured to receive induced electrical current from the magnetostrictive devices 424 and provide a conditioned output.

While the swash plate 418 is depicted at an exemplary angle with respect to the longitudinal axis of the downhole assembly section 400, the swash plate 418 may be oriented at any suitable angle. Moreover, one or more of the angle of the swash plate 418, the displacement of the one or more magnetostrictive devices 424, the turbine blade angles, and flow rate may be selected as needed to produce a desired amount of power and/or avoid excess power production that would require dissipation or shunting. In certain embodiments, the flow rate, turbine blade angles, and/or swash plate angle may be adjusted downhole.

Figure 4C:
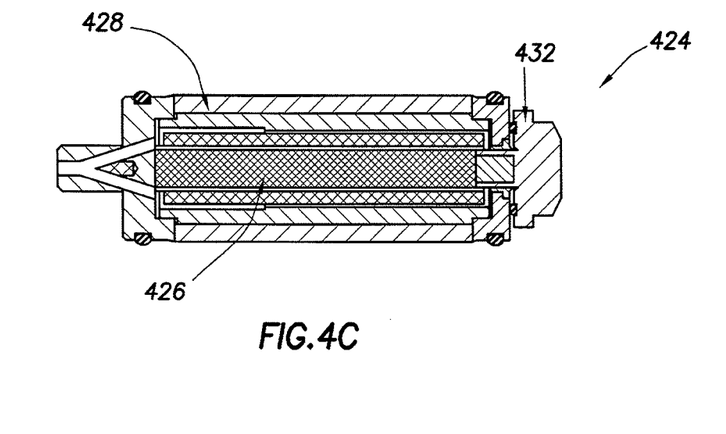
FIG. 4C is an illustration of another detailed partial cross-sectional view of the downhole assembly section of FIG. 4, in accordance with certain embodiments of the present disclosure.

FIG. 4C is an illustration of a detailed view of a magnetostrictive device 424, in accordance with certain embodiments of the present disclosure. The magnetostrictive material 426 may be in the form of a rod, for example. A wire coil 428 about the magnetostrictive material 426 may form the electrical connection of the magnetostrictive device 424. The magnetostrictive material 426 and the wire coil 428 may be housed within a housing assembly 430. A button assembly 432 may be coupled to the magnetostrictive material 426 and arranged to receive external forces and transfer corresponding axially directed forces to compress the magnetostrictive material 426. Sufficient compressive load transferred from the button assembly 432 may cause resulting strain in the magnetostrictive material 426. In response to that strain, the magnetostrictive material 426 may generate a magnetic field to produce an electric current in the wire coil 428. Electrical leads of the wire coil 428 may be disposed for connections at the end of the housing 430 generally opposite the button assembly 432.

Thus, as the swash plate 418 repetitively impacts the button assembly 432 of the one or more magnetostrictive devices 424, the magnetostrictive material 426 of the devices 424 produces corresponding repetitive electric currents. The electrical currents may be provided to the power conditioning electronics 428, which in turn may provide a conditioned output for powering one or more devices downhole. Accordingly, the sonde pressure housing 404 provides a magnetostrictive generator 417 that harvests the mechanical energy of the mud flow and generates electrical power by using the mechanical energy of the mud flow to ultimately induce oscillating strain in the magnetostrictive devices 424.

The electrical power can be used to power any downhole device such as logging while drilling, measurement while drilling, rotary steerable or other tools that are well known in the art. The electrical power can also be used to store energy in downhole rechargeable batteries to provide electrical power when the mud flow is off or to supplement power when needed such as peak demands or in case of a failure of the magnetostrictive generator where the batteries might serve as emergency power.

Figure 5:
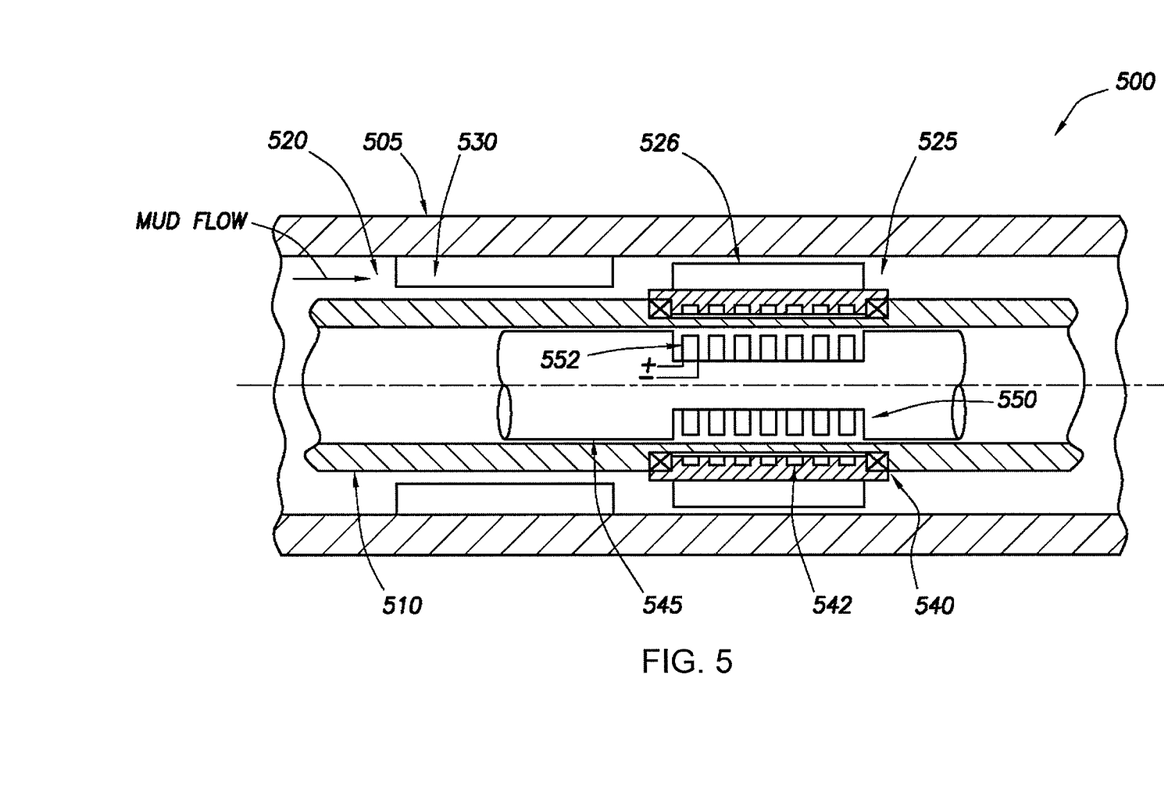
FIG. 5 is an illustration of an example drilling assembly section, in accordance with certain embodiments of the present disclosure.

FIG. 5 is an illustration of an example drilling assembly section 500 in accordance with certain embodiments of the present disclosure. The drilling assembly section 500 may be part of a larger drill string assembly that, for example, may be suspended in a wellbore by a derrick (not shown). The drilling assembly section 500 may be disposed near the bottom of the wellbore. The drilling assembly section 500 may include a collar 505 having disposed therein a housing 510, which may be a sonde pressure housing. Between the collar 505 and housing 510 may be formed an annulus 520 to accommodate the flow of drilling mud therethrough. A turbine 525 may be disposed within the collar 505 and may have a plurality of turbine blades 526, each curved so as to rotate the turbine 525 due to sufficient mud flow through the annulus 520. The turbine blades 526 may be similar to those shown in FIG. 1A and may have a particular right hand or left orientation to function as a flow rotor. A flow stator 530 may be affixed to the collar 505 have having multiple stator blades extending in a particular right hand or left orientation into the flow way to accelerate and turn the mud flow to a more suitable velocity and angle of incidence as the mud flow exits the stator 530 and enters the turbine blades 526.

Figure 5A:
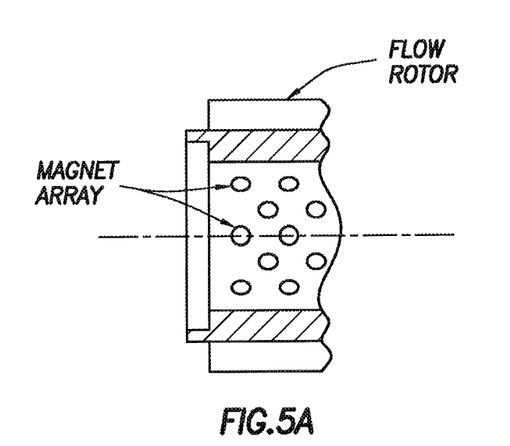
FIG. 5A is an illustration of a partial sectional view of the example drilling assembly section of FIG. 5, in accordance with certain embodiments of the present disclosure.

Coupled to the turbine 525 may be a rotating array 540 of magnetic material 542. FIG. 5A shows one non-limiting example of a magnetic array and flow rotor configuration. As such, the array 540 may be a rotating magnet array. The array 540 may be disposed around housing 510. A carriage 545 may be positioned within array 540 inside the housing 510. The carriage 545 may be fixed to the housing 510 and may remain stationary while the array 540 rotates.

Figure 5B:
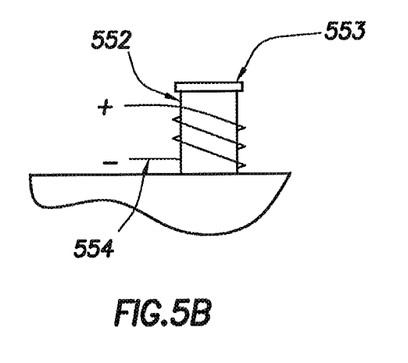
FIG. 5B is an illustration of a partial detailed view of the example drilling assembly section of FIG. 5, in accordance with certain embodiments of the present disclosure.

Affixed to the carriage 545 may be one or more magnetostrictive beam arrays 550. The magnetostrictive beam arrays 550 may include a plurality of beams 552, each beam 552 affixed to the carriage 545. FIG. 5B is an illustration of a magnetostrictive beam assembly where a magnetostrictive beam 552 may be affixed to the carriage 545 at one end, in accordance with certain embodiments of the present disclosure. Each beam 552 may include magnetostrictive material and may have one or more wire coils 554 disposed around it for electrical output. Each beam 552 may include a magnet or magnetic material cap 553.

As the array 540 rotates with the rotation of the turbine 525, the magnetic material 542 may likewise rotate past the magnetostrictive beam arrays 550 without making contact with the magnetostrictive beam arrays 550. The resulting oscillating magnetic field may cause alternating strain and relaxation of the beams 552. In response to that oscillating strain, the magnetostrictive material of the beams 552 may generate magnetic fields. About each beam 552 may be disposed a wire coil 554 in which the magnetic field of the beam 552 may induce an electric current. Accordingly, with drilling assembly section 500, one method of harvesting the mechanical energy and generating electrical power is by using the mechanical energy of the mud flow to ultimately induce oscillating strain in the magnetostrictive beam arrays 550. In this embodiment, an array of magnets may be affixed to the turbine and adapted to apply an oscillating magnetic field to the magnetostrictive beam array through the wall of the sonde pressure housing, thereby inducing strain in the magnetostrictive material inside the sonde pressure housing.

Accordingly, certain embodiments of the present disclosure allow for harvesting mechanical energy downhole and generating electrical power therefrom. And even though the figures depict embodiments of the present disclosure in a horizontal orientation, it should be understood by those skilled in the art that embodiments of the present disclosure are well suited for use in a variety of orientations. Accordingly, it should be understood by those skilled in the art that the use of directional terms such as above, below, upper, lower, upward, downward and the like are used in relation to the illustrative embodiments as they are depicted in the figures, the upward direction being toward the top of the corresponding figure and the downward direction being toward the bottom of the corresponding figure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A downhole assembly to harvest energy in a wellbore, the downhole assembly comprising:
   an impeller to be disposed in a wellbore;
   a shaft coupled to the impeller and disposed within a housing;
   a swash plate coupled to the shaft and disposed at an adjustable angle with respect to a plane perpendicular to a longitudinal axis of the shaft and a swash plate bearing surface of the swash plate;
   a magnetostrictive device proximate to the swash plate and comprising magnetostrictive material and a conductor proximate to the magnetostrictive material, wherein the impeller drives the shaft in response to fluid flow in the wellbore; and
   a rotating distal portion of the swash plate distal from the shaft, wherein the rotating distal portion of the swash plate rotates about the longitudinal axis of the shaft, and wherein the magnetostrictive material is alternately compressed and relaxed by the rotating distal portion of the swash plate, thereby inducing an electrical current in the conductor.

2. The downhole assembly of claim 1, wherein the impeller is coupled to the shaft disposed to provide a non-contact inertia drive.

3. The downhole assembly of claim 1, wherein the magnetostrictive material is in form of a rod.

4. The downhole assembly of claim 1, wherein the magnetostrictive device further comprises:
   a housing about the magnetostrictive material; and
   a button assembly coupled to the magnetostrictive material to transfer the alternating compressive load to the magnetostrictive material.

5. The downhole assembly of claim 1, further comprising:
   stator blades to accelerate the fluid flow toward the impeller.

* * * * *